US006737694B2

United States Patent
Kim et al.

(10) Patent No.: US 6,737,694 B2
(45) Date of Patent: May 18, 2004

(54) FERROELECTRIC MEMORY DEVICE AND METHOD OF FORMING THE SAME

(75) Inventors: Ki-Nam Kim, Kyunggi-do (KR); Yoon-Jong Song, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/066,172

(22) Filed: Jan. 30, 2002

(65) Prior Publication Data

US 2002/0109168 A1 Aug. 15, 2002

(30) Foreign Application Priority Data

Feb. 12, 2001 (KR) .......................................... 2001-6813

(51) Int. Cl.⁷ ............................................ H01L 27/108
(52) U.S. Cl. ...................... 257/296; 257/295; 257/298; 257/310; 257/532; 438/239; 438/396
(58) Field of Search ................... 257/295, 298, 257/310, 532; 438/3, 253, 254, 238, 239, 396

(56) References Cited

U.S. PATENT DOCUMENTS

| | | | |
|---|---|---|---|
| 5,119,154 A | | 6/1992 | Gnadinger |
| 5,411,911 A | * | 5/1995 | Ikeda et al. .................. 438/246 |
| 5,591,663 A | | 1/1997 | Nasu et al. |
| 5,854,104 A | | 12/1998 | Onishi et al. |
| 5,939,746 A | * | 8/1999 | Koyama et al. .............. 257/306 |
| 6,040,596 A | * | 3/2000 | Choi et al. ................... 257/306 |
| 6,214,663 B1 | * | 4/2001 | Cho et al. .................... 438/253 |
| 6,249,014 B1 | * | 6/2001 | Bailey ......................... 257/295 |
| 6,329,680 B1 | * | 12/2001 | Yoshida et al. .............. 257/296 |
| 6,396,092 B1 | * | 5/2002 | Takatani et al. ............. 257/295 |
| 2002/0011615 A1 | * | 1/2002 | Nagata et al. ............... 257/295 |

* cited by examiner

Primary Examiner—David Nelms
Assistant Examiner—Long Tran
(74) Attorney, Agent, or Firm—Marger Johnson & McCollom, P.C.

(57) ABSTRACT

A ferroelectric memory device along with a method of forming the same are provided. A first interlayer insulating layer is formed on a semiconductor substrate. A buried contact structure is formed on the first interlayer insulating layer. The buried contact structure is electrically connected to the substrate through a first contact hole extending through the first interlayer insulating layer. A blocking layer covers or encapsulates the buried contact structure and the first interlayer insulating layer. A second interlayer insulating layer is formed on the blocking layer. A ferroelectric capacitor formed on the second interlayer insulating layer and is electrically connected to the buried contact structure through a second contact hole that penetrates the second interlayer insulating layer and the blocking layer.

4 Claims, 7 Drawing Sheets

US 6,737,694 B2

FERROELECTRIC MEMORY DEVICE AND METHOD OF FORMING THE SAME

This application relies for priority upon Korean Patent Application No. 2001-6813, filed on Feb. 12, 2001, the contents of which are herein incorporated by reference in their entirety.

BACKGROUND OF THE INVENTION

1. Field of the Invention

The present invention relates generally to a ferroelectric memory device and a method of forming ferroelectric memory devices. More specifically, the present invention is directed to a ferroelectric memory device having a ferroelectric capacitor connected to a buried contact structure, as wells as a method of forming that device.

2. Description of Related Art

In current data processing systems, a Random Access Memory (RAM) is used to provide high-speed access to data, which is stored in the memory. Because the semiconductor industry is in continuous need of memory devices having even higher operation speeds, studies have been conducted on the use of a Ferroelectric Random Access Memory (hereinafter referred to as "FRAM"). A ferroelectric layer formed between capacitor electrodes provides a FRAM with non-volatile characteristics. In other words, the FRAM has two stable polarization states, represented by a hysterisis loop.

The FRAM has several advantages over other RAM devices. It has non-volatile characteristics as a flash memory. It also uses a relatively low operation voltage (approximately 5V), and has excellent operation speed (dozens of nanoseconds). In order to be usable in modern semiconductor products, however, FRAM devices must be highly integrated.

Like a dynamic random access memory (DRAM), the FRAM includes a transistor and a capacitor. The capacitor is a ferroelectric capacitor having a ferroelectric layer. The ferroelectric capacitor must be electrically connected to the transistor. Several approaches have been used to provide the electric connection between the capacitor and the transistor. One approach, disclosed in U.S. Pat. No. 5,119,154, uses a metal to provide a local interconnection. Unfortunately, this local interconnection approach is not suitable for high-density FRAMs because the local interconnection is fairly large and the size of the unit memory cells in high-density devices must be minimized.

Another approach uses a contact plug made of a conductive material to connect a source region of the transistor to the ferroelectric capacitor. The contact plug connection approach, disclosed in U.S. Pat. Nos. 5,854,104 and 5,591,663, has been widely used in the production of high-density FRAMs. FIG. 1 is a schematic cross-sectional view of a conventional ferroelectric memory device constructed using the conventional contact plug connection approach.

Referring to FIG. 1, a memory cell of a conventional FRAM includes a transistor 104 located on a semiconductor substrate 10. The transistor 104 has a drain region 106a, a source region 106b, and a gate electrode (not shown). A first interlayer insulating layer 108 is formed and planarized on the transistor 104 and the substrate 100. A bit line 112 is then formed on the first interlayer insulating layer 108. The bit line 112 is electrically connected to the drain region 106a through a predetermined part of the first interlayer insulating layer 108.

A second interlayer insulating layer 114 is formed on the first interlayer insulating layer 108 and the bit line 112. A contact hole 118 is formed through a predetermined region of the second and first interlayer insulating layers 114, 108. A contact plug 119 is formed in the contact hole 118. A ferroelectric capacitor 126 is formed on the second interlayer insulating layer 114 in electrical contact with the contact plug 119. A third interlayer insulating layer 128 is then formed on the second interlayer insulating layer 114 and the ferroelectric capacitor 126. The ferroelectric capacitor 126 is electrically connected to the source region 106b via the contact plug 119 formed through the second and first interlayer insulating layers 114, 108.

To form the contact plug 119, the first and second interlayer insulating layers 108, 114 must be etched to form the contact hole 118. Unfortunately, however, the first and second interlayer insulating layers 108, 114 are fairly thick, having thicknesses of about 4000 Å–6000 Å and 3000 Å–5000 Å, respectively. Furthermore, as the integration level of the semiconductor devices increases, the diameter of the contact holes decreases while an aspect ratio thereof increases. As a result, the contact hole 118 must be narrow and deep.

It is difficult to etch the narrow and deep contact hole 118. Problems such as a closed contact hole or an over-etched source region can occur. It is also difficult to fill the narrow and deep contact hole 118 with a conductive material, such as tungsten (W), having improved electric conductivity. Materials with better deposition characteristics, such as polysilicon, are therefore used to fill the contact hole 118. Polysilicon, however, is more resistive than tungsten (W) and therefore provides an inferior contact plug.

Still referring to FIG. 1, after the contact hole 118 is filled with polysilicon, it is then planarized down to a top surface of the interlayer insulating layer 114 to form a contact plug. Thereafter, a lower electrode 120, a ferroelectric layer 122, and an upper electrode 124 are formed and patterned over the contact plug 119 to form a ferroelectric capacitor 126 that is electrically connected to the contact plug 119.

A contact area between a polysilicon contact plug 119 and a lower electrode 120 is determined based upon a diameter of the contact hole 118. Since the diameter of a contact hole decreases as the integration of semiconductor device increases, however, it is difficult to secure a stable electrical contact between a lower electrode and a contact plug in high-density devices. Securing a stable contact in highly-integrated devices is a significant task.

In a conventional process of forming a ferroelectric layer 122 of the capacitor 126, a ferroelectric material is deposited and annealed in a high-temperature oxygen ambient. Through this process, the crystalline state of the ferroelectric material is thereby changed to a perovskite ferroelectric crystalline state. The high temperature used for this process is around 550° C. or higher. Annealing in an oxygen ambient is important in many steps of the semiconductor integration process. Unfortunately, this annealing process also causes the formation of a thin insulating layer (e.g., a silicon dioxide ($SiO_2$) layer) at an interface between the polysilicon contact plug and the lower electrode. This undesired byproduct can make it difficult to secure good contact between the contact plug and the lower electrode and result in a contact failure.

The conventional polysilicon contact plug approach for providing the connection between the ferroelectric capacitor and the transistor in the FRAM memory device is unable to provide the contact stability necessary to enable the high integration levels desired by the industry. The industry would be benefited by a ferroelectric memory device that improves the stability of the contact and therefore the integration level of the FRAM. A corresponding method is also desirable.

SUMMARY OF THE INVENTION

According to preferred aspects of the present invention, a lower electrode of a ferroelectric capacitor is electrically connected to a source region of a transistor through a buried contact structure that can be formed concurrently with a bit line. The buried contact structure therefore makes it possible to simplify the process steps.

In addition, an oxidation barrier layer is formed on the buried contact structure to prevent oxygen from contacting the buried contact structure during subsequent annealing in a high-temperature oxygen ambient. Also, where the buried contact structure is made of tungsten (W), for example, the formation of silicon dioxide ($SiO_2$) thereon is prevented.

Also, since the diameter of a top of the contact structure is greater than a diameter of a contact hole, the ratio of the contact area to capacitor size is increased over that of the conventional contact plug. Furthermore, compared with the conventional polysilicon contact plug process, the contact hole of this embodiment has a lower aspect ratio.

According to one embodiment of the present invention, a method of forming a ferroelectric memory device includes forming a transistor on a semiconductor substrate. A first interlayer insulating layer is formed on the transistor and the substrate. A buried contact structure and bit line are then formed on the first interlayer insulating layer. In this case, the buried contact structure and the bit line are electrically connected to a source and a drain of the transistor, respectively. A blocking layer to prevent oxygen diffusion is formed on the resulting structure. The buried contact structure and the bit line are thereby encapsulated by the blocking layer. A second interlayer insulating layer is formed on the blocking layer. A ferroelectric capacitor, electrically connected to the buried contact structure, is formed on the second interlayer insulating layer.

The buried contact structure and the bit line are preferably formed by patterning the first interlayer insulating layer to expose the source and the drain regions form first contact holes. A conductive layer is then formed in the first contact holes and on the first interlayer insulating layer. The conductive layer is patterned leaving a portion of the conductive layer in the first contact holes and on a region of the first interlayer insulating layer located on both sides of the contact holes.

Forming the ferroelectric capacitor preferably includes forming a second contact hole to expose the top surface of the buried contact structure. A lower capacitor electrode is formed on the second contact hole and the second interlayer insulating layer. A capacitor dielectric layer is then formed on the lower electrode. An upper capacitor electrode is formed on the dielectric layer. The upper electrode, dielectric layer, and lower capacitor electrode are then patterned.

A diameter of the second contact hole is preferably greater than that of the first contact hole. The contact structure of the capacitor remaining on the second interlayer insulating layer is also preferably maximized within a design rule. This results in an increase in a contact area between the lower electrode and the buried contact structure.

The lower capacitor electrode can be formed by sequentially stacking a first metal, an oxide of the first metal, and platinum on top of each other. The electrode can alternatively be formed from any one of those three materials alone or any combination thereof. The upper capacitor electrode is preferably made by stacking a second metal on a second metal oxide. Or it can be made from either one of those materials alone. The ferroelectric layer is preferably made of any one or more of the following materials: lead zircon titanate (PZT), lead lanthanum zirconate titanate (PLZT), strontium barium tantalum (SBT), strontium barium tantalum nitride (SBTN), strontium barium tantalum titanate (SBTT), $BaTiO_3$, $SrTiO_3$, $Bi_4Ti O_{12}$, and $PbTiO_3$.

In a preferred embodiment, the lower electrode is made by sequentially stacking iridium (Ir) (having a thickness of about 1500 Å), iridium dioxide ($IrO_2$) (having a thickness of about 500 Å), and platinum (Pt) (having a thickness of about 1500 Å). The upper electrode is preferably made by sequentially stacking $IrO_2$ (having a thickness of about 300 Å) and Ir (having a thickness of about 1200 Å). The ferroelectric layer is preferably made of PZT (having a thickness of about 2000 Å).

Also according to a preferred embodiment, a reaction barrier layer is formed on the ferroelectric capacitor and the second interlayer insulating layer. A third interlayer insulating layer is formed on the reaction barrier layer. A first interconnection line is formed on the third interlayer insulating layer. An inter-level dielectric film is formed on the first interconnection line. A second interconnection line is formed on the inter-level dielectric film to be electrically connected to the upper capacitor electrode.

The conductive material for forming the buried contact structure and the bit line is preferably made by stacking a tungsten (W) layer on a titanium/titanium nitride (Ti/TiN) adhesive layer/barrier layer. A blocking layer is preferably made of SiON, SiN, or aluminum oxide, having a thickness ranging from approximately 100 Å–500 Å, to prevent oxygen diffusion.

According to another aspect of the invention, a method of forming a ferroelectric capacitor FRAM memory cell includes forming a transistor on a semiconductor substrate. The transistor includes a source region, a drain region, and a gate electrode. A first interlayer insulating layer is formed on the transistor and the substrate. The first interlayer insulating layer is patterned to form first contact holes that expose the drain region and the source region. A conductive material is then used to form a conductive layer on the interlayer insulating layer and to fill the first contact holes. The conductive layer is patterned to form a buried contact structure and a bit line that are electrically connected to the source region and the drain region, respectively.

A blocking layer is formed on the buried contact structure, the bit line, and the first interlayer insulating layer to prevent oxygen diffusion. The buried contact structure and the bit line are thereby encapsulated. A second interlayer insulating layer is formed on the blocking layer. The second interlayer insulating layer and the blocking layer are patterned to expose a top region of the buried contact structure, forming a second contact hole. A ferroelectric capacitor is formed on the second interlayer insulating layer and is electrically connected to the buried contact structure through the second contact hole. A diameter of the second contact hole is preferably larger than that of the first contact hole. A contact area between a lower electrode of the capacitor and the buried contact structure is also preferably increased to improve a contact therebetween.

The conductive material preferably includes a sequentially stacked adhesive layer/barrier layer of titanium/titanium nitride (Ti/TiN) and a conductive layer of tungsten (W). An oxygen diffusion blocking layer is preferably made of SiON, SiN, or aluminum oxide. The blocking layer preferably has a thickness ranging between about 100 Å–500 Å.

The ferroelectric capacitor is preferably constructed by forming a lower capacitor electrode on the second contact hole and on the second interlayer insulating layer. A ferroelectric layer is formed on the lower capacitor electrode. An upper electrode is then formed on the ferroelectric layer. The upper electrode, the ferroelectric layer, and the lower electrode are then patterned. In addition, a reaction barrier layer can be formed on the ferroelectric capacitor and the second interlayer insulating layer. A third interlayer insulating layer is formed on the reaction barrier layer. A first interconnection line is formed on the third interlayer insulating layer. An inter-level dielectric film is formed on the first interconnection line. A second interconnection line is formed on the inter-level dielectric film and is electrically connected to the upper capacitor electrode.

The lower electrode can be made by sequentially stacking Ir (having a thickness of about 1500 Å), $IrO_2$ (having a thickness of about 500 Å), and platinum (having a thickness of about 1500 Å). The ferroelectric layer can be made of PZT (having a thickness of about 2000 Å). The upper electrode can be made by sequentially stacking $IrO_2$ (having a thickness of about 300 Å) and Ir (having a thickness of about 1200 Å).

According to another aspect of the invention, a transistor of a ferroelectric memory device is formed on a semiconductor substrate. First and second interlayer insulating layers are then sequentially formed on the substrate. A buried contact structure and bit line are interposed between the interlayer insulating layers and are respectively electrically connected to source and drain regions of the transistor through first contact holes formed in the first interlayer insulating layer. A blocking layer is formed on the buried contact structure, the bit line, and the first interlayer insulating layer to prevent oxygen diffusion. A lower capacitor electrode, formed on the second interlayer insulating layer, is electrically connected to the buried contact structure via a second contact hole formed through the second interlayer insulating layer and the blocking layer. A ferroelectric capacitor has a lower electrode, a ferroelectric layer, and an upper electrode. A diameter of the second contact hole is preferably larger than that of the first contact hole to increase a contact area between the lower electrode and the buried contact structure.

BRIEF DESCRIPTION OF THE DRAWINGS

A more thorough understanding of the benefits and advantages of the present invention will be obtained through the following detailed description of preferred embodiments, made with reference to the accompanying drawings, in which.

DETAILED DESCRIPTION OF PREFERRED EMBODIMENTS

Although the invention will now be described in terms of certain preferred embodiments thereof, the invention may be embodied in different forms and should not be construed as limited to the specific embodiments set forth herein. It should also be noted that the drawings are not to scale and that the thicknesses of layers and regions, in particular, have been exaggerated for clarity.

When a semiconductor wafer is formed, numerous devices are simultaneously formed during the fabrication process. For convenience in the following description, however, the embodiments of the invention will be described with respect to only one bit line, two ferroelectric capacitors, one first interconnection line, and two second interconnection lines. Detailed descriptions of conventional processes such as a device isolation process, an interlayer insulating layer forming process, a transistor process, and a photo-etching process will also be omitted.

Figure 2:
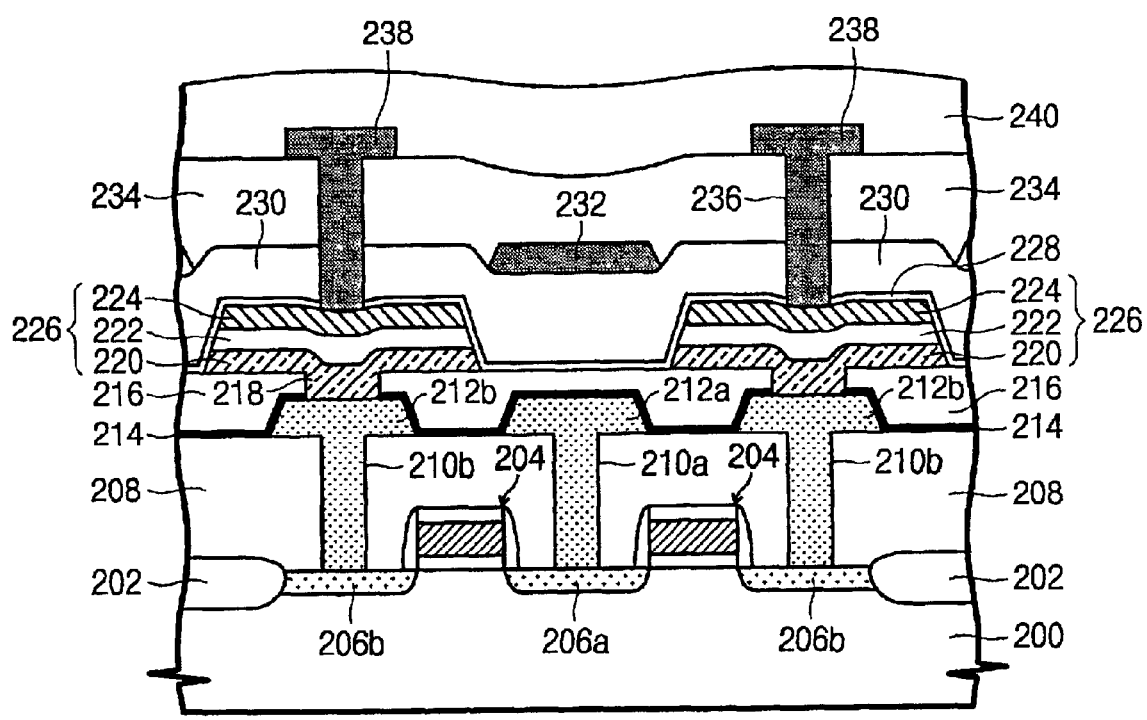
FIG. 2 is a cross-sectional view of a ferroelectric memory device according to one embodiment of the present invention, schematically showing a novel contact plug arrangement.

According to a preferred embodiment of this invention, a ferroelectric capacitor is connected to a source region of a transistor through a buried contact structure. As a result, high integration and improved electrical contact can be achieved. FIG. 2 is a schematic cross-sectional view of a ferroelectric memory device according to a preferred embodiment of the present invention.

Referring to FIG. 2, a device isolation area 202 is formed on a predetermined region of a semiconductor substrate 200 to define an active region. A transistor 204 is formed on the active region of the substrate 200. The transistor 204 includes a gate electrode, a source region 206b, and a drain region 206a. A first interlayer insulating layer 208 is formed on the substrate 200 and the transistor 204. First contact holes 210a, 210b are formed in the first interlayer insulating layer 208.

A bit line 212a and a buried contact structure 212b are formed on the first interlayer insulating layer 208, each filling a respective one of the first contact holes 210a, 210b. A second interlayer insulating layer 216 is formed on the first interlayer insulating layer 208, the bit line 212a, and the buried contact structure 212b. A ferroelectric capacitor 226 is formed on the second interlayer insulating layer 216 to be electrically connected to the buried contact structure 212b. The ferroelectric capacitor 226 is made by sequentially stacking a lower electrode 220, a ferroelectric layer 222, and an upper electrode 224. The lower electrode 220 is electrically connected to the buried contact structure 212b through a second contact hole 218 formed in the second interlayer insulating layer 216.

A blocking layer 214 is formed on the first interlayer insulating layer 208, buried contact structure 212b, and bit line 212a to prevent oxygen diffusion. The blocking layer 214 covers and encapsulates the contact structure 212b, except at a region of contact between the buried contact structure 212b and the lower electrode 220. In other words, other than at the contact between the buried contact structure 212b and the lower electrode 220, the buried contact structure 212b is surrounded and protected by the blocking layer 214.

A third interlayer insulating layer 230 is formed on the ferroelectric capacitor 226 and the second interlayer insulating layer 216. A first interconnection line 232 is formed on the third interlayer insulating layer 230. Although not shown in the drawing, the first interconnection line 232 is electrically connected to a gate electrode of a transistor. An inter-level dielectric film 234 is formed on the third interlayer insulating layer 230 including the first interconnection line 232. A second interconnection line 238 is formed on the inter-level dielectric film 234 through the inter-level dielectric film 234 and the third interlayer insulating layer 230. A passivation layer 240 is formed on the inter-level dielectric film 234 and the second interconnection line 238.

In summary, according to this embodiment of the invention, a lower electrode 220 of the ferroelectric capacitor 226 is electrically connected to the source region 206b of the transistor 204 through the buried contact structure 212b in the insulating layers (first and second interlayer insulating layers 208, 216). The oxygen diffusion blocking layer 214 substantially completely covers and encapsulates the buried contact structure 212b. The blocking layer 214 can be also formed on the bit line 212a and the first interlayer insulating layer 208, as well as the buried contact structure 212b.

Figure 1:
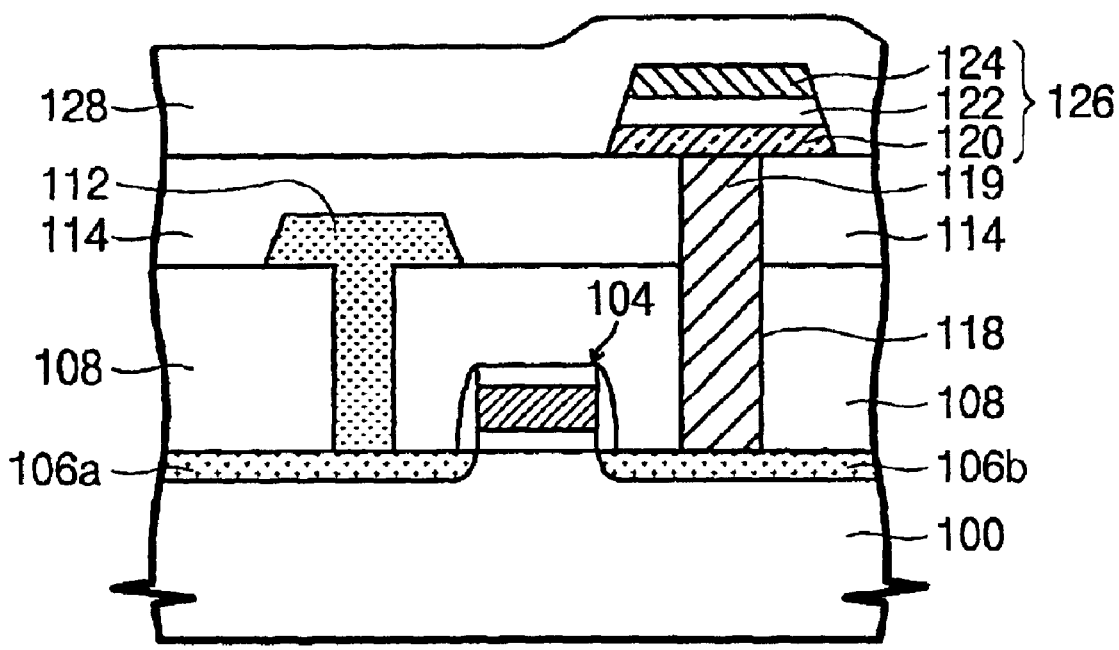
FIG. 1 is a cross-sectional view of a conventional ferroelectric memory device, schematically showing a contact plug arrangement according to the prior art.

A second contact hole 218 is formed in the second interlayer insulating layer 216, electrically connecting the lower electrode 220 to the buried contact structure 212b. A contact area between the lower electrode 220 and the buried contact structure 212b is thereby increased above that of the prior art. In this case, a diameter of the second contact hole 218 is larger than that of the first contact holes 210a, 210b. The second interlayer insulating layer 216 (having a thickness of about 1000 Å or less) is thinner than an insulating layer 114 (which has a thickness of about 3000 Å–5000 Å) of the prior art (see FIG. 1). The distance between the lower electrode 220 and the source region 206b is therefore smaller than in the prior art.

Because the buried contact structure 212b and bit line 212a are both made of a material having good conductive properties, such as tungsten (W), the conductivity of the buried contact structure 212b is improved over that of the prior art contact plug. Also beneficially, a silicon dioxide (SiO$_2$) layer, which basically functions as an insulating layer, is not formed at an interface between the buried contact structure 212b and the lower electrode 220.

In the preferred embodiment, the buried contact structure 212b and the bit line 212a are made of a conductive material obtained by sequentially stacking an adhesive layer/barrier layer of titanium/titanium nitride (Ti/TiN) and a tungsten (W) layer. The oxygen diffusion blocking layer 214 is preferably made of SiON, SiN, or Al$_2$O$_3$, having a thickness ranging from about 100 Å–500 Å. The lower electrode 220 of the capacitor is preferably made by sequentially stacking iridium (Ir) (having a thickness of about 1500 Å), iridium dioxide (IrO$_2$) (having a thickness of about 500 Å), and platinum (Pt) (having a thickness of about 1500 Å). The ferroelectric layer is preferably made of PZT, having a thickness of about 2000 Å. The upper electrode 224 is preferably made by stacking Ir, having a thickness of about 1200 Å, on IrO$_2$, having a thickness of about 300 Å. The ferroelectric memory device also preferably includes an aluminum oxide or titanium dioxide diffusion barrier layer 228 that covers the ferroelectric capacitor 226.

The first and second interconnection lines 232, 238 are preferably made of aluminum and have excellent electrical characteristics. The second interconnection line 238 is used as a plate line. The first interconnection line 232 is formed over a word line, in the same direction as the word line, to compensate for gate resistance in the transistor 204. The first interconnection line 232 is periodically electrically connected to the word line.

Figure 3A:
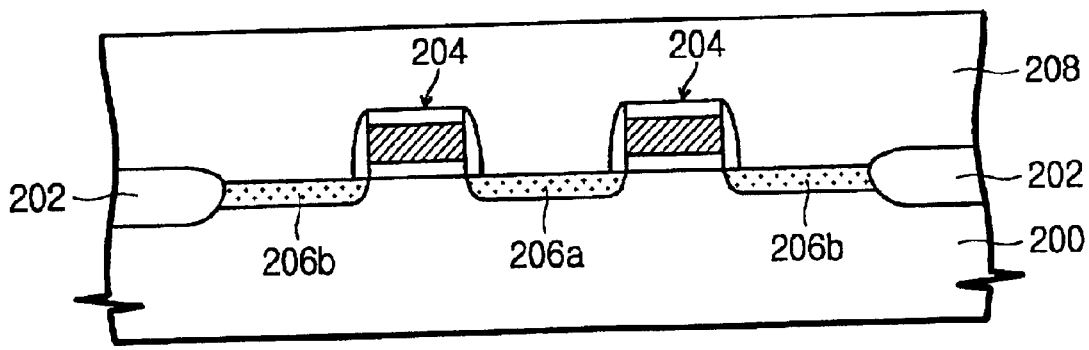
FIG. 3A through FIG. 3J are cross-sectional views of a semiconductor substrate illustrating a method of forming the ferroelectric memory device of FIG. 2.

A method of forming a ferroelectric memory device, according to another aspect of this invention, will now be described more fully with reference to FIG. 3A through FIG. 3J. Referring to FIG. 3A, a device isolation layer 202 is formed on a predetermined area of a semiconductor substrate 200 to define an active region. Either local oxidation of silicon (LOCOS) or shallow trench isolation (STI) can be used, for example, as the device isolation technique. The detailed description of these conventional device isolation techniques will be omitted herein.

After the active region is defined, a transistor is formed. A gate oxide layer (not shown) is formed for electrical isolation to the substrate 200. Gate electrode and capping layers (also not shown) are deposited and patterned to form a gate electrode. A source 206b and a drain 206a, which are impurity diffusion areas, are formed on the sides of the gate electrode through conventional ion implantation and annealing processes. Gate spacers are formed on the sidewalls of the gate electrode, thereby completing the formation of a transistor 204.

A first interlayer insulating layer 208 is then formed over the substrate 200 including the transistor 204. The first interlayer insulating layer 208 is preferably made of an oxide, such as BPSG, USG, or PE-TEOS, and is planarized by chemical mechanical polishing (CMP) to a thickness ranging between about 4000 Å–6000 Å.

Figure 3B:
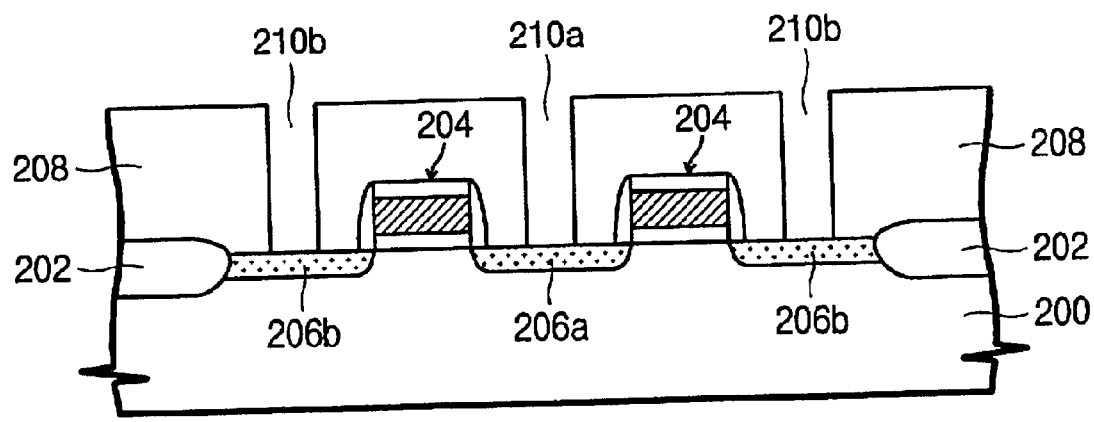
Figure 3C:
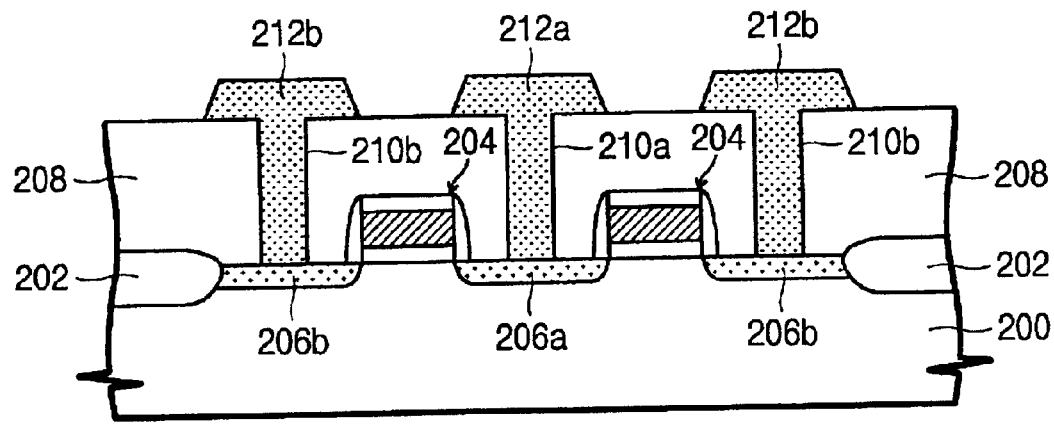

FIGS. 3B and 3C schematically illustrate the process of forming a bit line and a buried contact structure. Referring to FIG. 3B, the first interlayer insulating layer 208 is patterned to form first contact holes 210a, 210b exposing the drain region 206a and the source region 206b, respectively. Referring to FIG. 3C, a conductive material, such as tungsten (W), is used to form a conductive layer on the first interlayer insulating layer 208. The conductive material also completely fills the first contact holes 210a, 210b in the first interlayer insulating layer 208. Using a photolithographic process, the conducive layer is then patterned to form a buried contact structure 212b and a bit line 212a. The resulting buried contact structure 212b and bit line 212a are respectively electrically connected to the source region 206b and the drain region 206a through the first contact holes 210b, 210a, respectively.

A Ti/TiN layer serving as a reaction barrier/contact layer is preferably formed before formation of the conductive, tungsten (W) layer. Following these steps, the conductive material remains on a region of the first interlayer insulating layer 208 around a top of the first contact holes 210b, 210a, as well as in the contact holes 210b, 210a. An upper diameter of the buried contact structure 212b is therefore larger than a diameter of the first contact hole 210b. A margin of a photolithographic etching process and a contact area between the buried contact structure 212b and a lower electrode 220 (see FIG. 3F) are thereby increased.

Figure 3D:
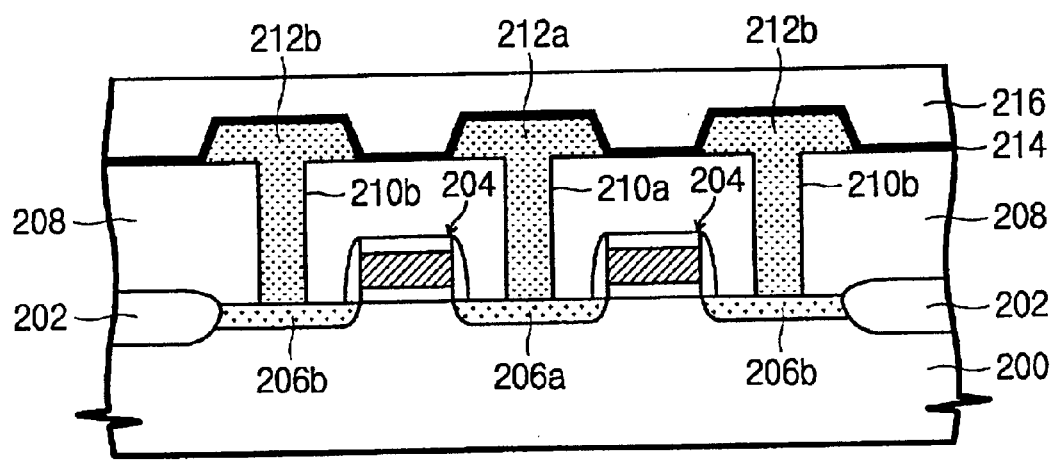

Referring to FIG. 3D, a blocking layer 214 is formed on the buried contact structure 212b, the bit line 212a, and the first interlayer insulating layer 208 to prevent oxygen diffusion. The buried contact structure 212b is thereby encapsulated by the blocking layer 214. The blocking layer 214 is preferably made of SiON, SiN, or aluminum oxide, each of which provide a strong oxidation barrier layer. The SiON layer and SiN layers can be formed by chemical vapor deposition (CVD), while the aluminum layer can be formed by atomic layer deposition (ALD). These materials are only exemplary, however, and any insulating material can be used to block oxygen diffusion. The blocking layer 214 is preferably formed having a thickness ranging between about 100 Å–500 Å.

A second interlayer insulating layer 216 is then formed on the blocking layer 214. Like the first interlayer insulating layer 208, the second interlayer insulating layer 216 is also made of an oxide, preferably by CVD. The second interlayer insulating layer 216 is then planarized to a thickness of about 1000 Å or less. The second interlayer insulating layer 216 is preferably thin enough that a lower capacitor electrode can smoothly contact the buried contact structure 212*b*.

Figure 3E:
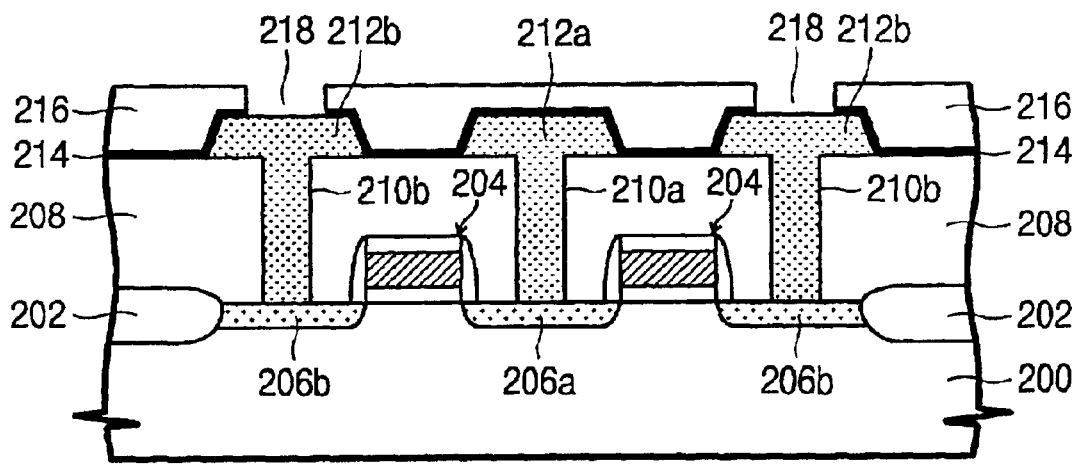

Referring now to FIG. 3E, the second interlayer insulating layer 216 and the blocking layer 214 are patterned to form a second contact hole 218, exposing the buried contact structure 212*b*. The second contact hole 218 is larger than the first contact holes 210*b*, 210*a*. An aspect ratio of the second contact hole 218 is preferably smaller than that of the first contact holes 210*b*, 210*a*. A top surface of the buried contact structure 212*b* is preferably entirely exposed.

Figure 3F:
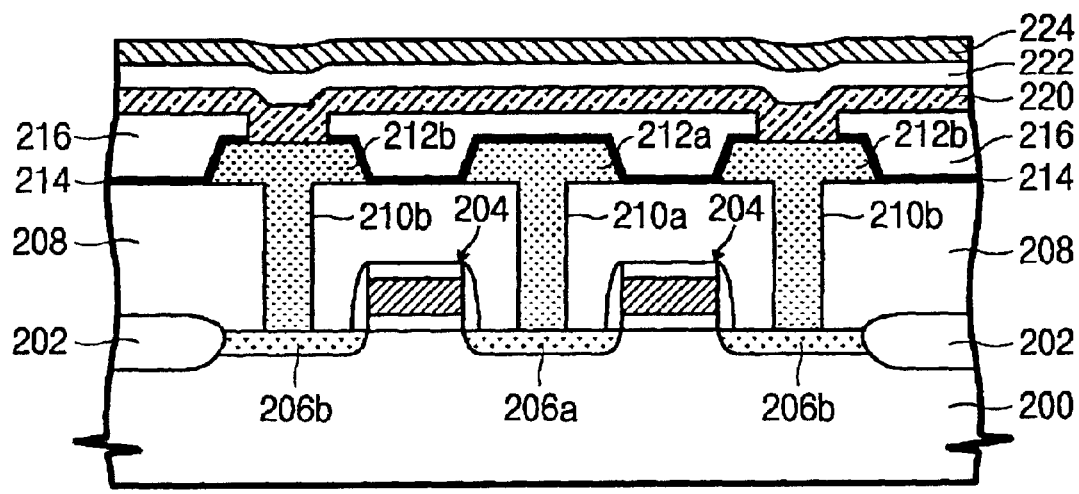

Referring to FIG. 3F, a lower electrode 220, a ferroelectric layer 222, and an upper electrode 224 are sequentially formed on the resulting structure after the second contact hole 218 is formed. The lower electrode 220 preferably completely fills the second contact hole 218 to form a contact area. The size of the contact area between the lower electrode 220 and the buried contact structure 212*b* is thereby increased to improve a contact therebetween.

The lower electrode 220 can be made, for example, of iridium (Ir), rhodium (Rh), ruthenium (Ru), platinum (Pt), or oxides thereof. The lower electrode 220 preferably includes a multi-layer structure in which metal, metal oxide, and platinum are sequentially stacked. In the preferred embodiment, an iridium/iridium dioxide/platinum multi-layer structure is used. In this embodiment, the iridium is formed by sputtering to a thickness of about 1500 Å. The iridium dioxide is then deposited by sputtering to a thickness of about 500 Å. In order to form a stable oxide electrode, the lower electrode 220 is then annealed in an oxygen ambient. The platinum supplies a lattice structure for crystallization of the later deposited ferroelectric layer 222, thereby providing a stable ferroelectric layer.

The ferroelectric layer 222 can be made of lead zircon titanate (PZT), lead lanthanum zirconate titanate (PLZT), strontium barium tantalum (SBT), strontium barium tantalum nitride (SBTN), strontium barium tantalum titanate (SBTT), $BaTiO_3$, $SrTiO_3$, $Bi_4TiO_{12}$, and/or $PbTiO_3$. In the preferred embodiment, PZT is deposited to a thickness of about 2000 Å by a sol-gel or a CVD process. In order to achieve the desired ferroelectric characteristics, the PZT is subjected to crystallization annealing in a high-temperature oxygen ambient.

The upper electrode 224 is preferably formed having a multi-layer structure in which metal oxide and a metal electrode are sequentially stacked. In the preferred embodiment, the upper electrode 224 is made of iridium dioxide/iridium layers. More specifically, the iridium dioxide layer is preferably formed to a thickness of about 300 Å by sputtering, and the iridium layer is preferably formed to a thickness of about 1200 Å by sputtering. In order to provide a stable oxide electrode, the upper electrode 224 is annealed in an oxygen ambient. Alternatively, the upper electrode 224 could be made of the same material as the lower electrode 220.

Figure 3G:
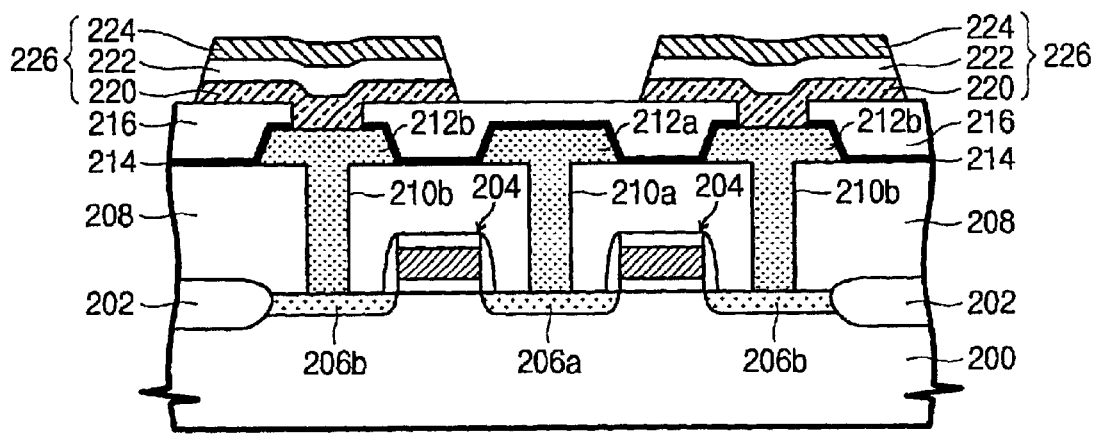
Figure 3H:
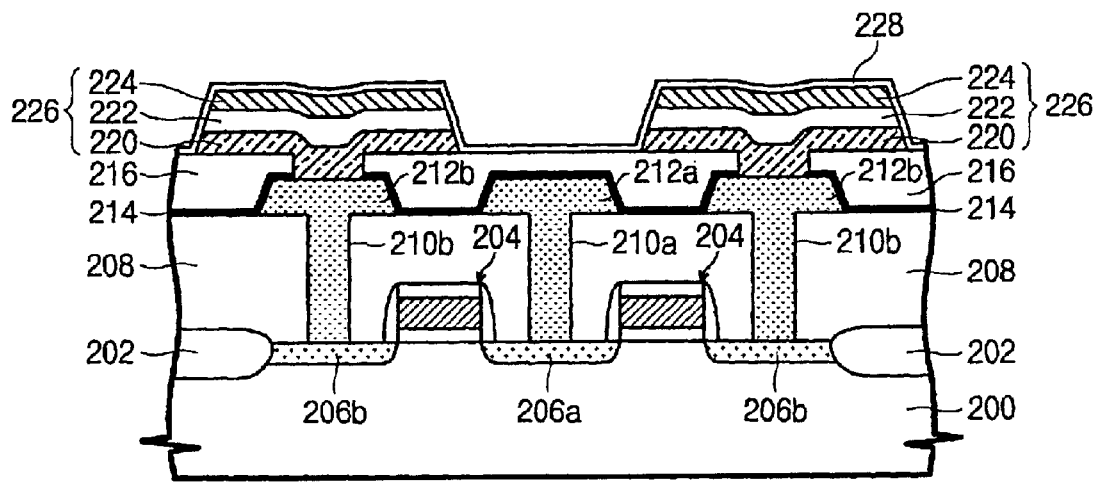

Referring to FIG. 3G, the layers 224, 222, and 220 are sequentially patterned to form a ferroelectric capacitor 226 that is electrically connected to the buried contact structure 212*b*. Referring to FIG. 3H, a reaction barrier layer 228 is deposited to prevent material from moving in or out of the ferroelectric capacitor 226. The reaction barrier layer 228 is then subjected to annealing in an oxygen ambient to reinforce its characteristics. The reaction barrier layer 228 can be made, for instance, of titanium dioxide or aluminum oxide.

The preferred embodiment of the present invention employs a tungsten buried contact structure whose top is completely encapsulated by an oxygen diffusion blocking layer. Using this structure, the buried contact is not oxidized during an annealing process in high-temperature oxygen ambient (such as after deposition of the iridium dioxide, ferroelectric, and diffusion barrier layers). In addition, the undesirable silicon dioxide insulating layer does not form on the contact because the buried contact structure is made of tungsten (W).

Figure 3I:
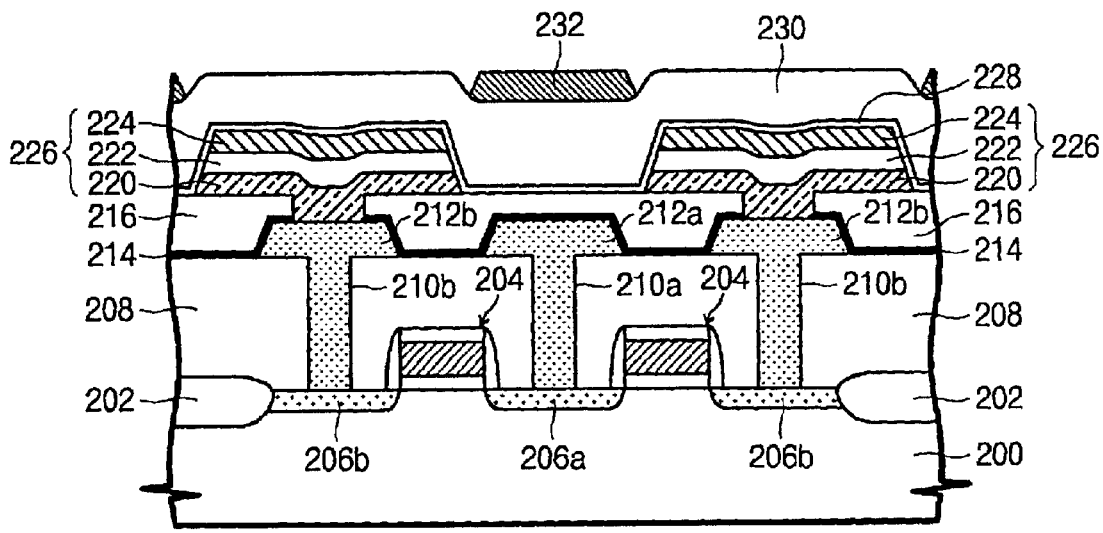

A process of forming a first interconnection line is schematically illustrated in FIG. 3I. Referring to FIG. 3I, a third interlayer insulating layer 230 is formed on the reaction barrier layer 228. In order to improve the electrical conductivity of a transistor, metal is then deposited and patterned to form the first interconnection line 232. The first interconnection line 232 is preferably made of aluminum. Although not shown in the drawing, the first interconnection line is preferably arranged parallel with a gate electrode and is electrically connected to a predetermined region thereof.

Figure 3J:
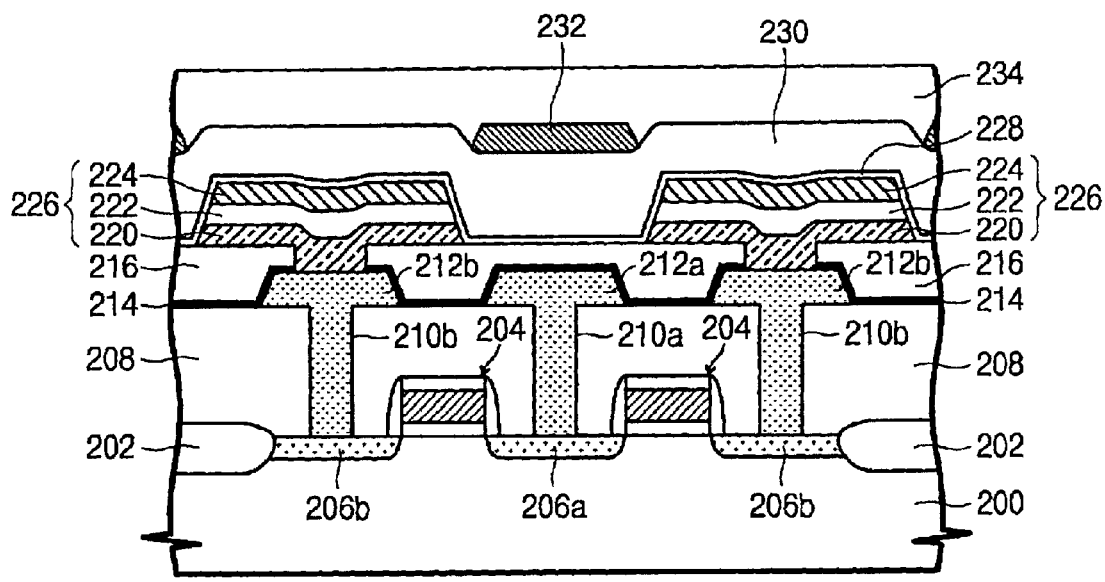

A process of forming a second interconnection line (plate line) is schematically illustrated in FIG. 3J. Referring to FIG. 3J, after forming the first interconnection line 232, an inter-level dielectric film 234 is formed to insulate the first interconnection line 232. With additional reference to FIG. 2, a second interconnection line 238 is also formed, and is electrically connected to the upper electrode 224 of the ferroelectric capacitor. More particularly, the inter-level dielectric film 234, the third interlayer insulating layer 230, and the reaction barrier layer 228 are patterned to form a via hole 236, exposing the upper electrode 224. Aluminum is then deposited and patterned thereon to form the second interconnection line (plate line) 238. A passivation layer 240, which acts as an insulating layer, is then formed to insulate the second interconnection line 238 during a subsequent process.

In summary, various aspects of the present invention provide several advantages over the prior art. Among other things, a preferred embodiment of the present invention employs a buried contact structure in which a first (buried) contact hole and a second (bit line) contact hole are formed in a first interlayer insulating layer. This results in an aspect ratio of the contact holes that is lower than that of a conventional contact hole for a contact plug. Accordingly, even though the deposition characteristics of tungsten (W) are inferior to polysilicon (which has inferior conductivity), tungsten (W) can be used to form the buried contact structure. An overhang phenomenon can also be prevented. The buried contact structure and the bit line can also be formed concurrently, simplifying the bit line fabrication process.

Although the present invention has been shown and described with respect to various preferred embodiments thereof, numerous variations and modifications will be apparent to those skilled in the art. The present invention is therefore not limited to the specific embodiments described above but should be interpreted to cover all such variations and modifications coming within the spirit and scope of the invention as defined by the appended claims.

What is claimed is:

1. A ferroelectric memory device comprising:
   a first interlayer insulating layer formed on a semiconductor substrate;
   a buried contact structure contacting the substrate through a first contact hole extending through the first interlayer insulating layer, the buried contact structure formed over and in contact with the first interlayer insulating layer;
   a blocking layer formed over and in contact with the buried contact structure and the first interlayer insulating layer;

a second interlayer insulating layer formed on the blocking layer; and a ferroelectric capacitor with a metallic lower electrode, wherein the lower electrode contacts the buried contact structure through a second contact hole that penetrates the second interlayer insulating layer and the blocking layer, and wherein the lower electrode is formed over and in contact with the second interlayer insulating layer.

2. The ferroelectric memory device according to claim 1, wherein the blocking layer comprises a material chosen from the group consisting of silicon oxynitride (SiON), silicon nitride (SiN), and aluminum oxide.

3. The ferroelectric memory device according to claim 1, wherein a diameter of the second contact hole is larger than a diameter of the first contact hole.

4. The ferroelectric memory device according to claim 1, wherein the buried contact structure is made of tungsten (W).

* * * * *